United States Patent
Huang et al.

(10) Patent No.: US 7,205,201 B2
(45) Date of Patent: Apr. 17, 2007

(54) CMOS COMPATIBLE PROCESS WITH DIFFERENT-VOLTAGE DEVICES

(75) Inventors: Chih-Feng Huang, Jhubei (TW);
Ta-yung Yang, Milpitas, CA (US);
Jenn-yu G. Lin, Taipei (TW);
Tuo-Hsin Chien, Tucheng (TW)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 10/914,943

(22) Filed: Aug. 9, 2004

(65) Prior Publication Data
US 2006/0030107 A1    Feb. 9, 2006

(51) Int. Cl.
*H01L 21/8234* (2006.01)
(52) U.S. Cl. .................. 438/275; 438/299
(58) Field of Classification Search ............. 438/275, 438/299, 301
See application file for complete search history.

(56) References Cited

U.S. PATENT DOCUMENTS 6,927,114 B2    8/2005  Park .................. 438/200
2004/0171197 A1 *  9/2004  Park .................. 438/142

* cited by examiner

*Primary Examiner*—Bradley K. Smith
(74) *Attorney, Agent, or Firm*—J.C. Patents

(57) ABSTRACT

A method of manufacturing different-voltage devices mainly comprises forming at least one high-voltage well in high-voltage device regions, at least one N-well in low-voltage device regions, at least one P-well in low-voltage device regions, source/drain wells in high-voltage device regions, and isolation wells in isolation regions in a p-type substrate. The breakdown voltage is adjusted by modulating the ion doping profile. Furthermore, parameters of implanting conductive ions are adjusted for implanting conductive ions into both high-voltage device regions and low-voltage device regions. The isolation wells formed in isolation regions between devices are for separating device formed over high-voltage device regions and device formed over low-voltage device regions. The thickness of a HV gate oxide layer is thicker than the thickness of an LV gate oxide layer for modulating threshold voltages of high-voltage devices and low-voltage devices.

11 Claims, 7 Drawing Sheets

CMOS COMPATIBLE PROCESS WITH DIFFERENT-VOLTAGE DEVICES

BACKGROUND OF THE INVENTION

1. Field of the Invention

The present invention relates to a method of manufacturing semiconductor device, and more particularly to a method of manufacturing different-voltage semiconductor devices.

2. Description of Related Art

The single chip process for integrating power switches with control circuitry is a major trend in the field of power IC development. Its objective is to integrate high-voltage devices and low-voltage devices in a single process for reducing the manufacturing cost and increasing industrial utilization. However, in traditional applications the process is complicated and the disturbance between high-voltage devices and low-voltage devices is unavoidable. Meanwhile, since electronic characteristics of high-voltage devices and low-voltage devices are different, e.g. threshold voltage, there exist lots of difficulties in circuit design. Traditional processes usually have their own structures or procedures particularly for high-voltage transistor, but those structures or procedures would reduce utilization and increase the manufacturing cost.

Therefore, a method for manufacturing different-voltage devices in a single process while compatible with a standard process is desired.

SUMMARY OF THE INVENTION

The present invention relates to a method of manufacturing different-voltage devices in a single process. The method of the present invention is compatible with a standard CMOS process to enhance industrial applications. The method only requires two additional masks in a standard CMOS process, namely a HV (high voltage) well mask and a HV gate oxide mask. The method of the present invention is capable of integrating different-voltage devices, such as low-voltage devices and high-voltage devices. Each device is isolated from other devices, and the threshold voltage of high-voltage devices can be controlled to be close to that of low-voltage devices. This can reduce the disturbance between different-voltage devices.

The method according to an embodiment of the present invention is described as follows. Firstly, HVNW (high-voltage N-well) regions are defined and formed in the semiconductor substrate. This is where the first additional mask is added. Next, a HV gate oxide is formed before forming a LV (low-voltage) gate oxide. This is where the second additional mask is added. The sequence of other steps of the process is identical as a standard CMOS process.

These and other objectives, features and advantages of the present invention will become apparent to those skilled in the art upon consideration of the following description of the preferred embodiments of the present invention taken in conjunction with the accompanying drawings.

DETAILED DESCRIPTION OF THE INVENTION

Figure 1:
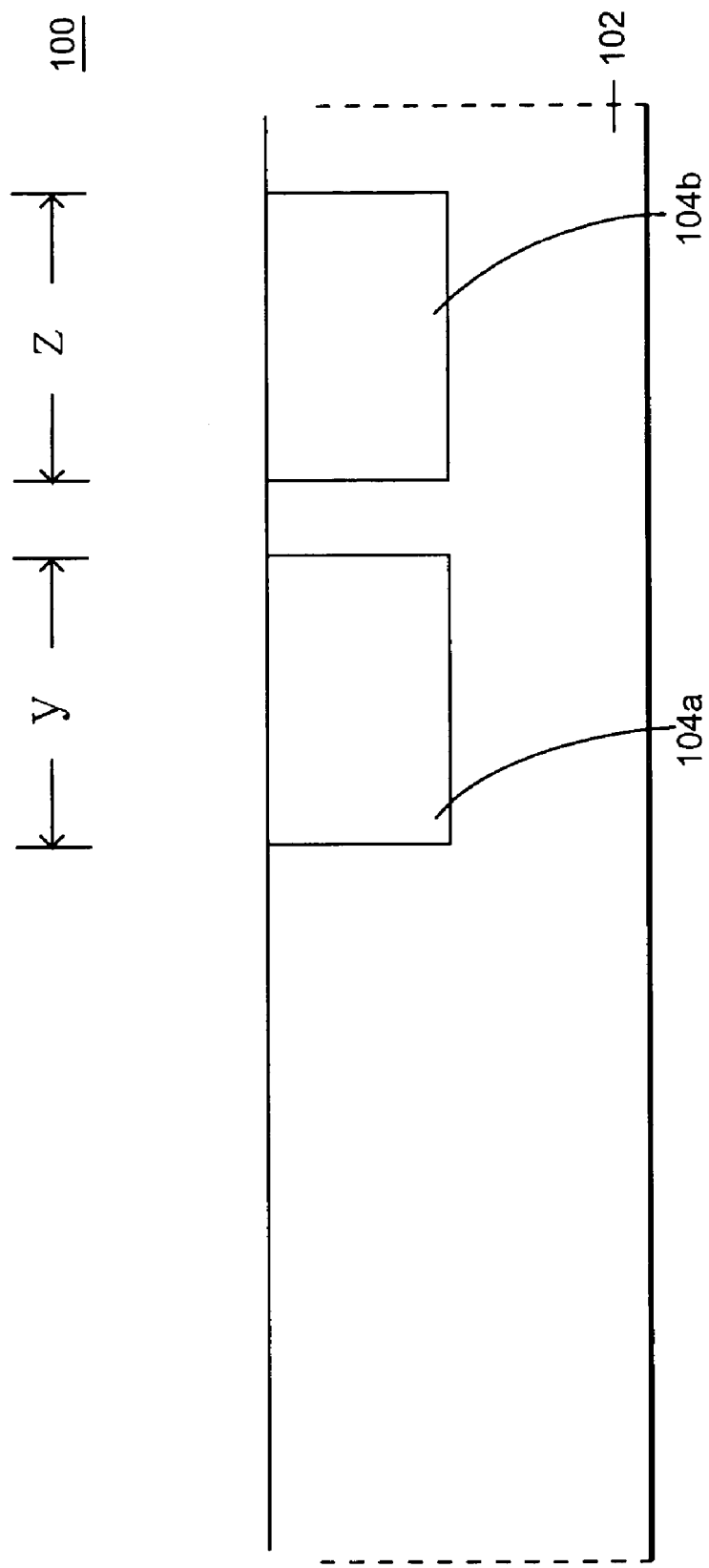
FIGS. 1–7 illustrates cross-sectional views showing the progressive process steps of manufacturing different-voltage devices compatible with standard CMOS processes according to an embodiment of the present invention.

Referring to FIG. 1, a substrate 102 e.g. a p-type doping layer is provided. Next, HVNW (high-voltage N-well) 104a, 104b are formed in the substrate 102 for forming a high-voltage NMOS and a high-voltage PMOS respectively. It should be noted that a first additional mask is required for forming the HVNW 104a and the HVNW 104b. A region z defines a high-voltage PMOS region while a region y defines a high-voltage NMOS region.

Figure 2:
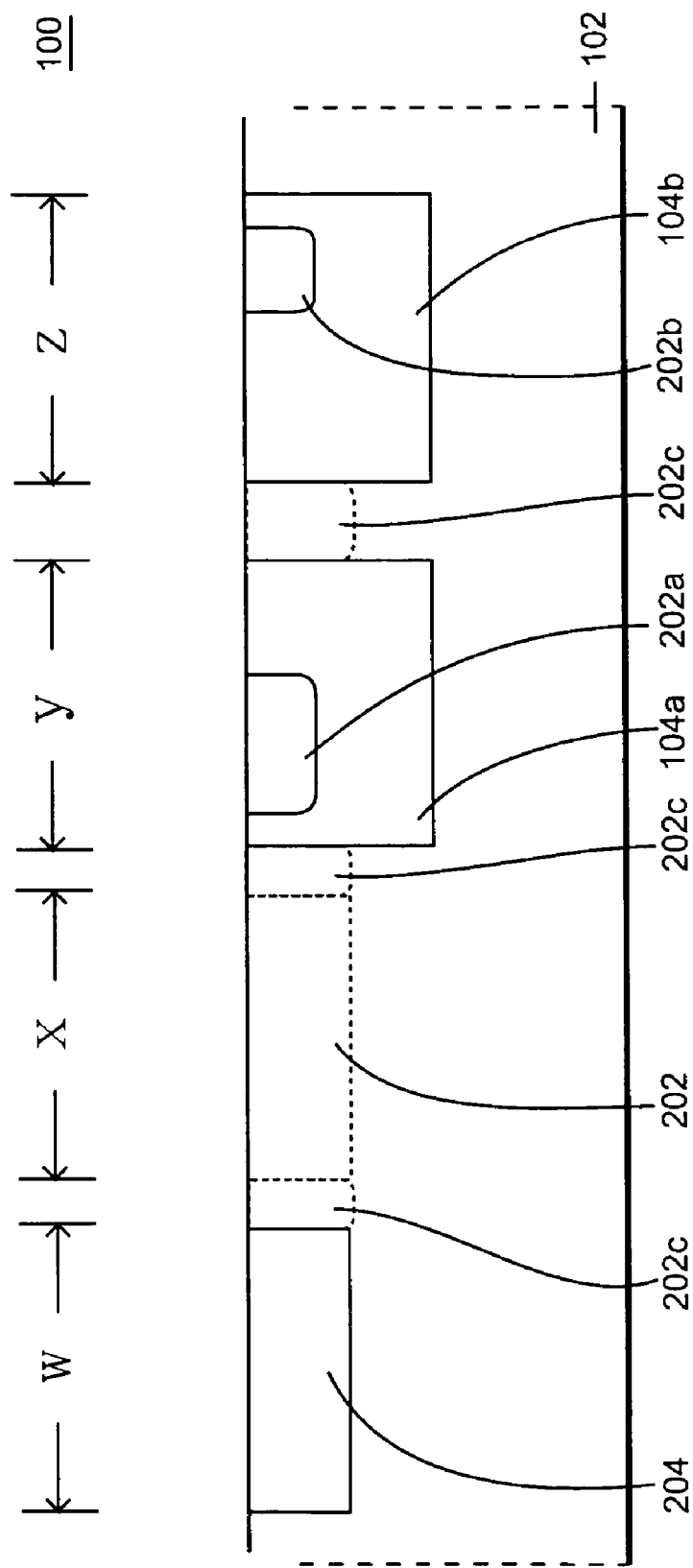

Referring to FIG. 2, an N-well (NW) 204, a P-well (PW) 202, a PW 202a, a PW 202b and PW 202c are formed in the substrate 102. The NW 204, e.g. an n-type doping well, is for forming a low-voltage PMOS. The PW 202, e.g. a p-type doping well, is for forming a low-voltage NMOS. The PW 202a formed in the high-voltage NMOS is for forming a part of a source region of the high-voltage NMOS. The PW 202b formed in the high-voltage PMOS is for forming a part of a drain region of the high-voltage PMOS. The PW 202c is for forming an isolation structure. A region x defines a low-voltage NMOS region while a region w defines a low-voltage PMOS region. By adjusting ion implantation parameter, the P-well can be formed according to desired requirement. This can greatly reduce the overall manufacture cost. Furthermore, the aforementioned process is compatible with a standard CMOS process.

Figure 3:
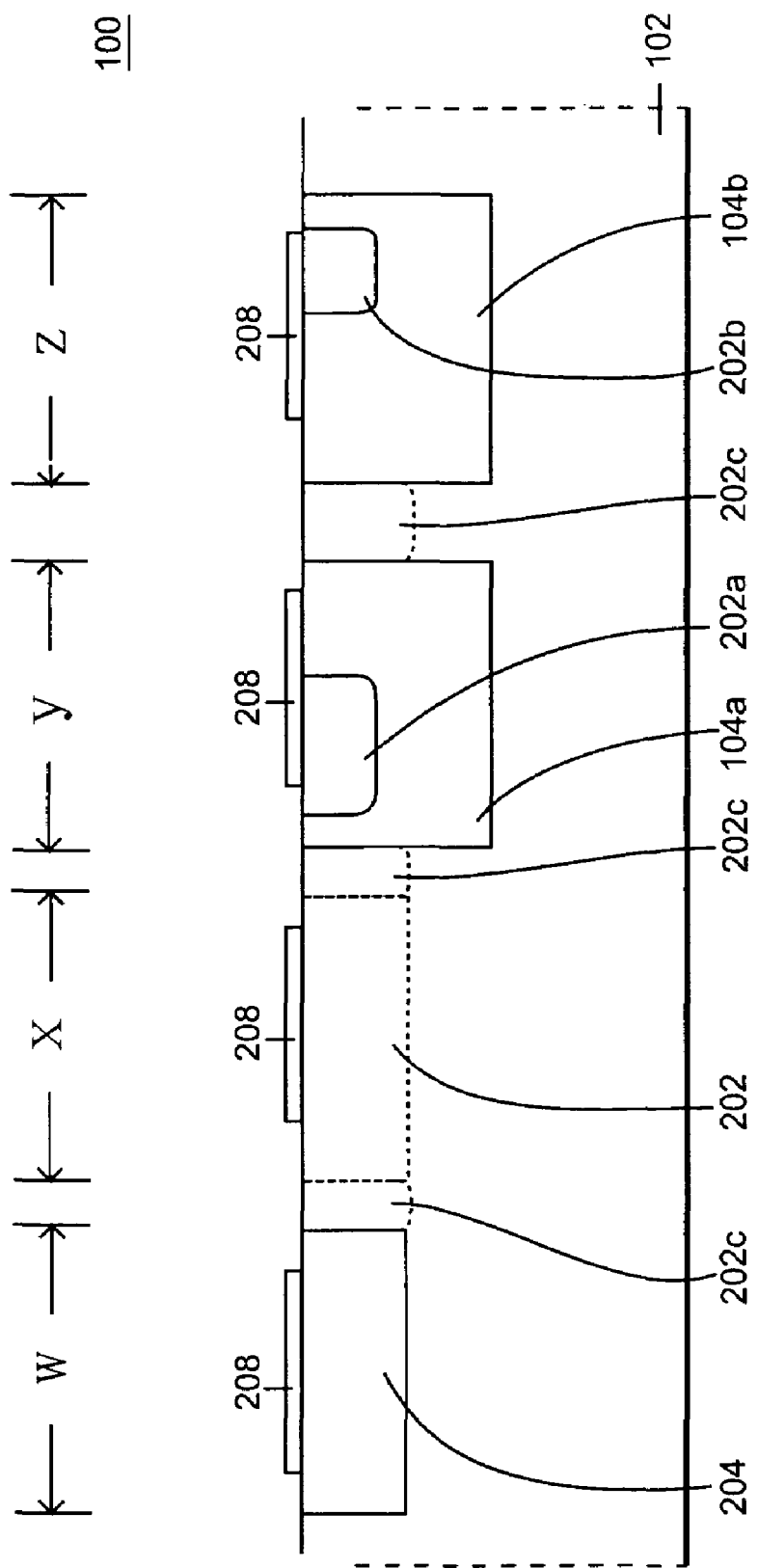

Referring to FIG. 3, a patterned nitride layer 208 is formed over the substrate 102 covering areas of the substrate where field oxidation is not desired.

Figure 4:
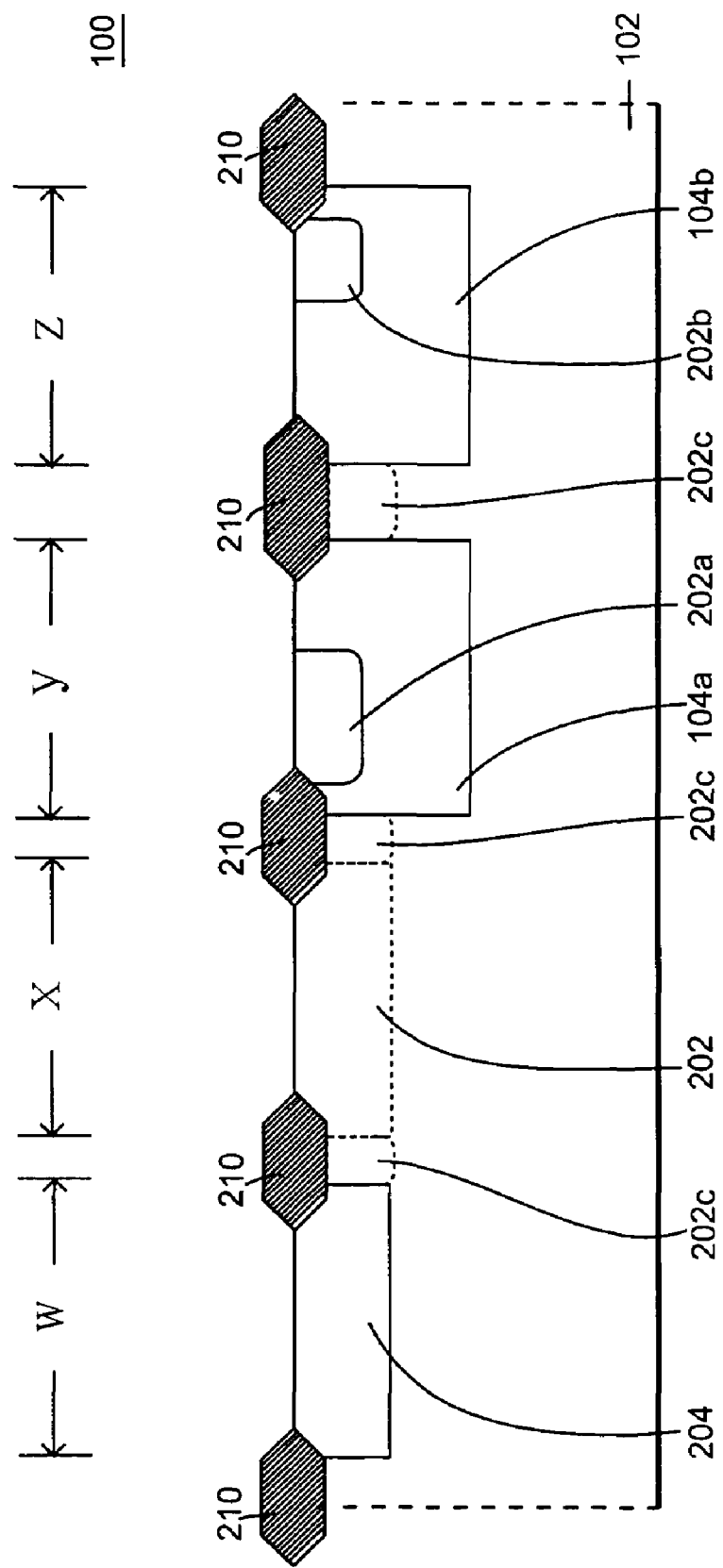

Referring to FIG. 4, field oxidation is carried out to form a field oxide 210 in the exposed areas of the substrate 102 for isolating the low-voltage NMOS, the low-voltage PMOS, the high-voltage PMOS, and the high-voltage NMOS. Subsequently, the nitride layer 208 is removed.

Figure 5:
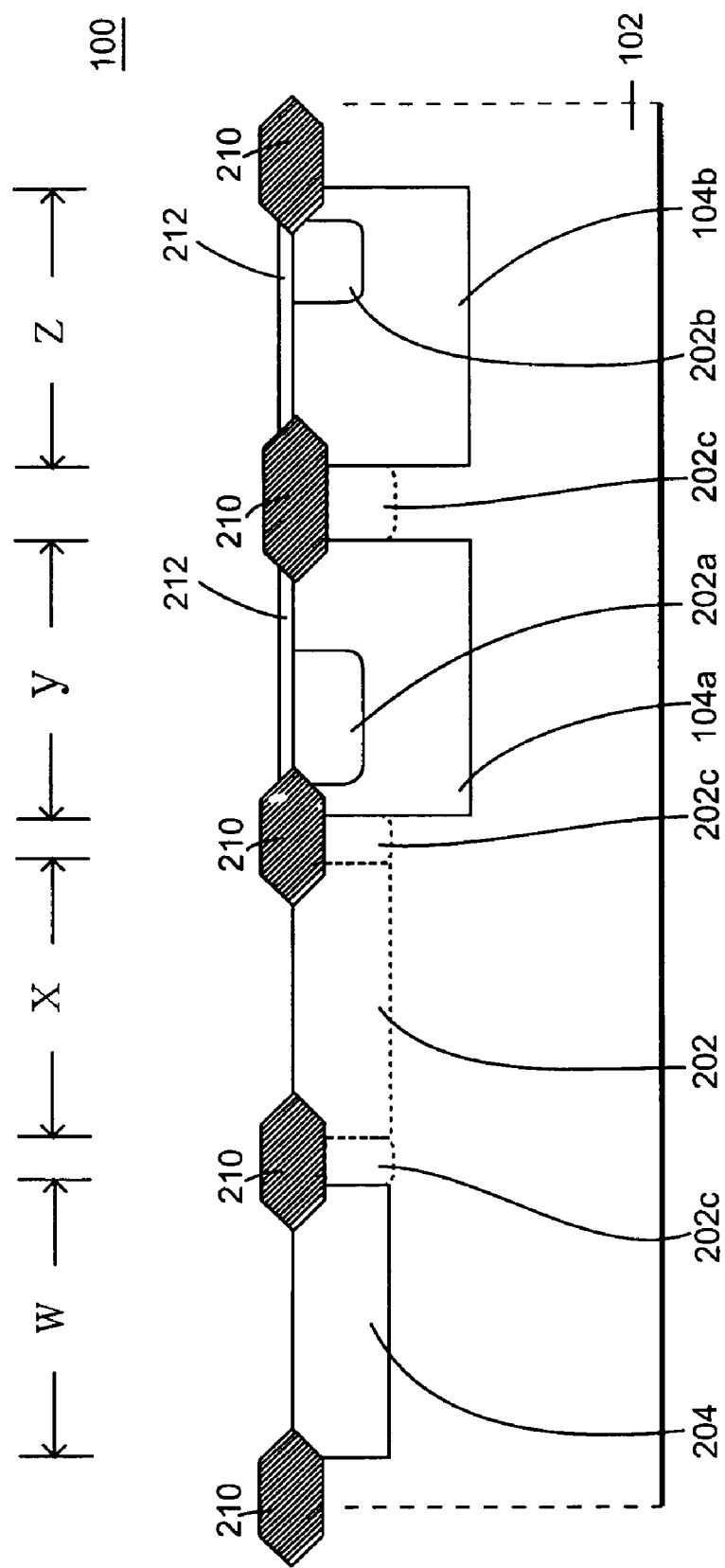

Referring to FIG. 5, a HV (high-voltage) gate oxide layer 212, e.g. $SiO_2$ is formed over the surface of the high-voltage NMOS and the high-voltage PMOS. It should be noted that a second additional mask is required for forming the HV gate oxide layer 212. By modulating the doping profile of N-well/P-well and fabrication step of the HV gate oxide layer 212, the threshold voltage of high-voltage devices and low-voltage devices an be modulated to achieve desired characteristics.

Figure 6:
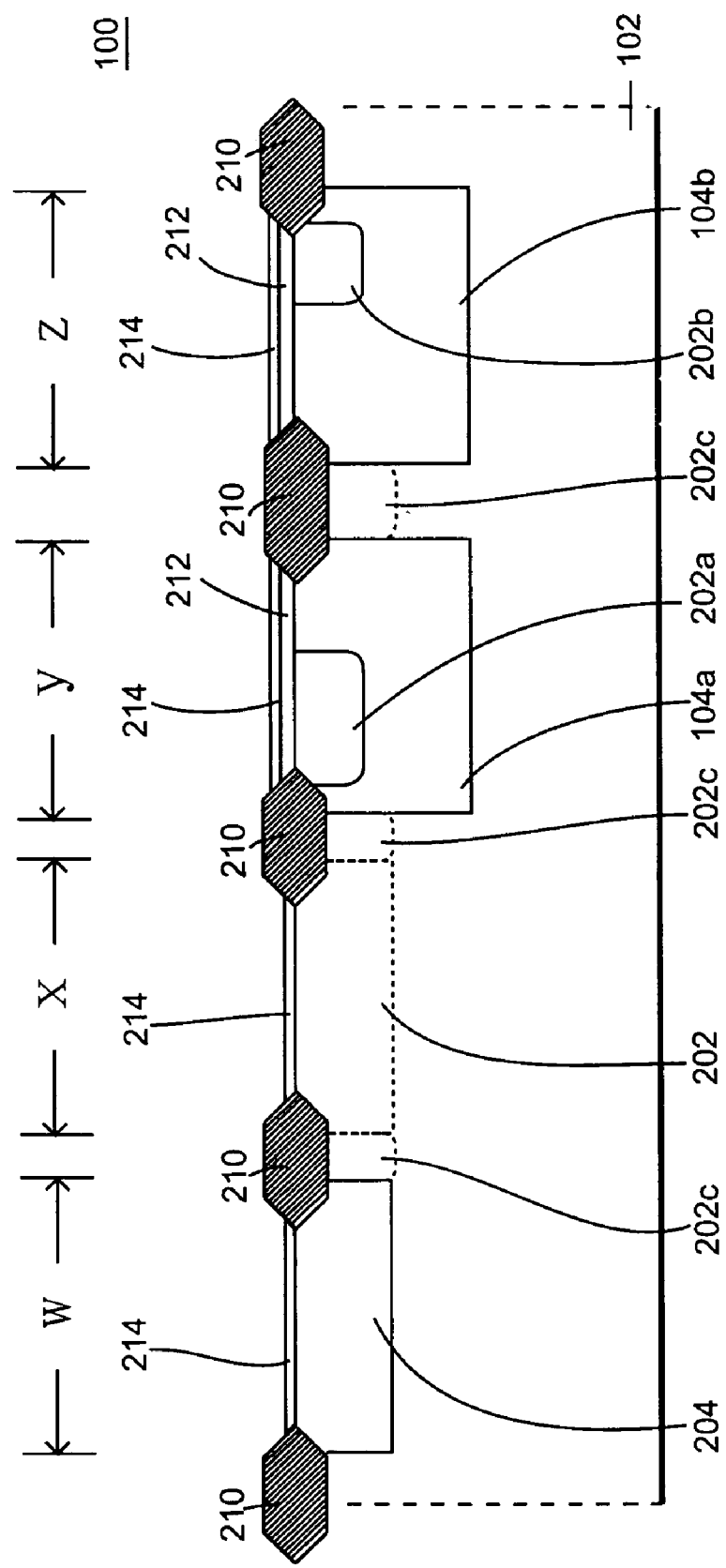

Referring to FIG. 6, a standard CMOS process is carried out to form a low-voltage (LV) gate oxide layer 214 over the surface of the low-voltage NMOS, the low-voltage PMOS, the high-voltage NMOS, and the high-voltage PMOS. The electrical characteristics of high-voltage devices and low-voltage devices are different. The HV gate oxide layer 212 is applied in high-voltage devices. The LV gate oxide layer 214 is applied in low-voltage devices. It should be noted that, it is preferable that the HV gate oxide layer 212 is prior to forming the LV gate oxide layer 214 in order not to adversely affect the formation of LV gate oxide layer 214. The formation of the LV gate oxide layer 214 does not require an additional mask.

Figure 7:
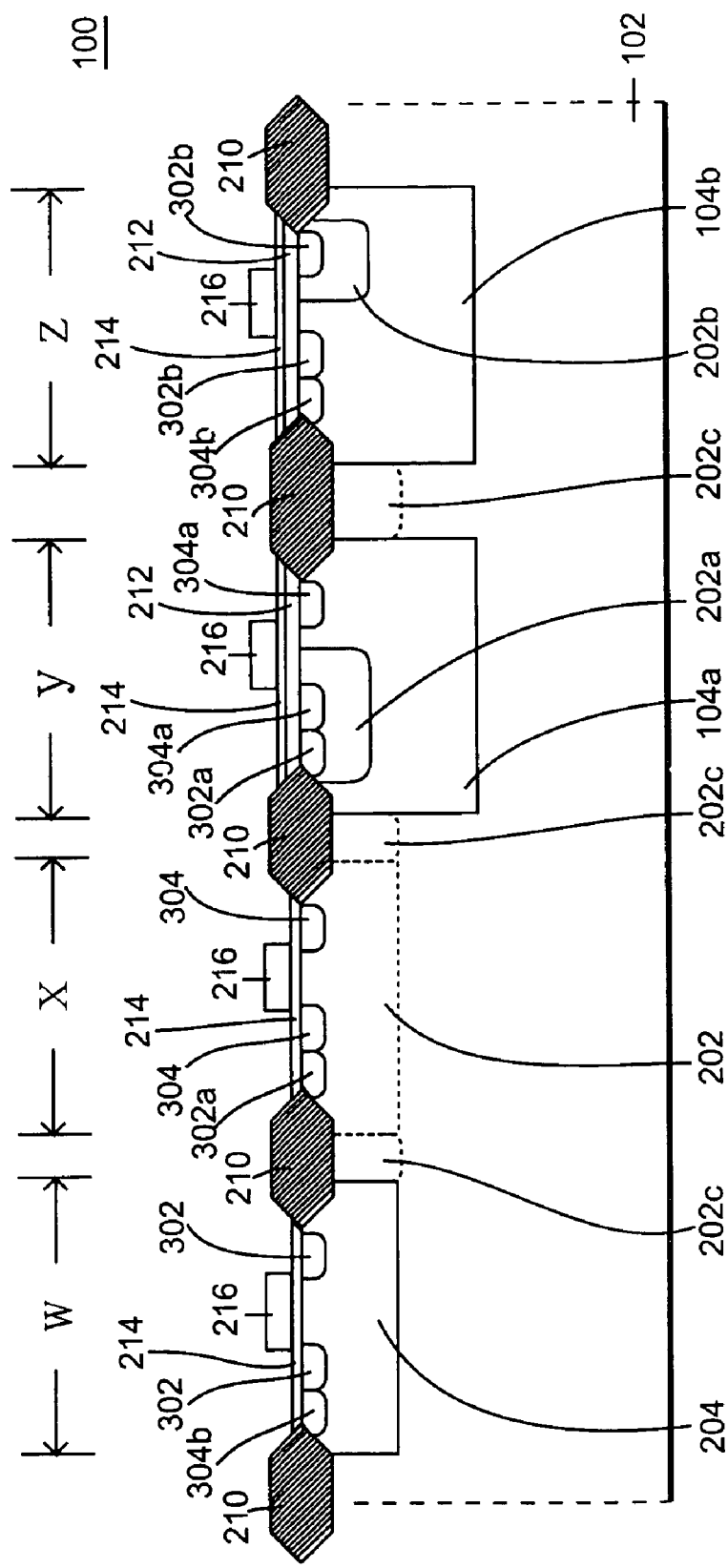

As shown in FIG. 7, a patterned poly layer 216 is formed over the HV gate oxide layer 212 and the LV gate oxide layer 214. The poly layer of the patterned poly layer 216 is in the form of polycrystalline. Thereafter, NSD (N+ Source/Drain) regions 304, 304a, 304b, and PSD (P+ Source/Drain) regions 302, 302a, 302b are formed. The NSD regions contain N+ conductive ions, and the PSD regions contain P+ conductive ions. The NSD region 304 serves as the drain/source of the low-voltage NMOS. The NSD region 304a serves as the drain/source of the high-voltage NMOS, and the NSD 304*b* region serves as the body contact of the high-voltage PMOS and the low-voltage PMOS. The PSD region 302 serves as the drain/source of the low-voltage PMOS. The PSD region 302*b* serves as the drain/source of the high-voltage PMOS. The NSD region 302*a* serves as the body contact of the high-voltage NMOS and the low-voltage NMOS.

In the present embodiment of the present invention, the CMOS compatible process of manufacturing and integrating different-voltage devices including a HVNW and a HV gate oxide layer requires two additional masks. A high-voltage MOS, for example, can bear a voltage more than 30V, and the threshold voltage of the high-voltage MOS and a low-voltage MOS can be controlled to achieve required value. Since the process of the present invention is compatible with a standard CMOS process, the existing CMOS manufacture facility may be utilized without incurring additional capital investment on hardware or software. Thereby the overall lead-time and manufacture cost for manufacturing the different-voltage devices can be reduced. Accordingly, this process is a very unique process, particularly in a semiconductor industry, for integrating high-voltage MOS and low-voltage MOS.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process of manufacturing different-voltage devices, comprising steps of:
   providing a substrate, wherein low-voltage device regions, high-voltage device regions, and isolation regions can be formed in;
   forming at least one high-voltage well in said substrate;
   forming at least one N-well in said low-voltage device regions, at least one P-well in said low-voltage device regions, source/drain wells in said high-voltage device regions, and isolation wells in said isolation regions;
   forming a patterned nitride layer over said substrate;
   forming a field oxide layer over said isolation region;
   forming a HV gate oxide layer over said high-voltage device regions;
   forming an LV gate oxide layer over said low-voltage device regions and said high-voltage device regions;
   forming a poly layer over said high-voltage device regions and said low-voltage device regions; and
   forming PSD/NSD regions in said high-voltage device regions and said low-voltage device regions.

2. The process of manufacturing different-voltage devices as claimed in claim 1, wherein process parameters of forming at least one high-voltage well in a substrate are adjusted to determine a breakdown voltage thereof.

3. The process of manufacturing different-voltage devices as claimed in claim 1, wherein steps of forming at least one N-well in said low-voltage device region, at least one P-well in said low-voltage device region, source/drain wells in said high-voltage device region, and said isolation wells in said isolation regions comprises steps of:
   forming an N-well mask over desired regions, wherein said desired regions may be said low-voltage device regions, source/drain wells in said high-voltage device regions, and isolation wells in said isolation regions;
   forming a P-well mask over desired regions, wherein said desired regions may be said low-voltage device regions, source/drain wells in said high-voltage device regions, and isolation wells in said isolation regions;
   implanting N-type conductive ions and P-type conductive ions to form N-wells and P-wells respectively; and
   driving in said N-type conductive ions and said P-type conductive ions.

4. The process of manufacturing different-voltage devices as claimed in claim 1, wherein process parameters of forming wells in said low-voltage device regions and said high-voltage device regions are adjusted for implanting ions into both said high-voltage regions and said low-voltage device regions simultaneously.

5. The process of manufacturing different-voltage devices as claimed in claim 1, wherein said isolation wells in said isolation regions are for isolating devices formed over said low-voltage device regions from devices formed over said high-voltage device regions.

6. The process of manufacturing different-voltage devices as claimed in claim 1, wherein forming said HV gate oxide layer over said high-voltage device regions comprises steps of:
   forming a HV gate oxide mask over said high-voltage device regions; and
   forming said HV gate oxide layer over said high-voltage device regions.

7. The process of manufacturing different-voltage devices as claimed in claim 1, wherein a thickness of said HV gate oxide layer is thicker than a thickness of said LV gate oxide layer.

8. The process of manufacturing different-voltage devices as claimed in claim 1, wherein a threshold voltage of devices formed over said low-voltage device regions and said high-voltage device regions is adjusted by adjusting a thickness of said HV gate oxide layer and a thickness of said LV gate oxide layer.

9. The process of manufacturing different-voltage devices as claimed in claim 1, wherein forming PSD/NSD regions in said low-voltage device regions and said high-voltage device regions comprises steps of:
   forming a PSD/NSD mask over said low-voltage device regions and said high-voltage device region;
   implanting N+ conductive ions to form a source/drain of NMOS devices and a body contact of PMOS devices;
   implanting P+ conductive ions to form a source/drain of said PMOS device and a body contact of said NMOS device; and
   driving in said N+ conductive ions and said P+ conductive ions.

10. The process of manufacturing different-voltage devices as claimed in claim 9, wherein parameters of implanting N+ conductive ions are adjusted for implanting said N+ conductive ions into both said high-voltage device regions and said low-voltage device regions.

11. The process of manufacturing different-voltage devices as claimed in claim 9, wherein parameters of implanting P+ conductive ions are adjusted for implanting said P+ conductive ions into both said high-voltage device regions and said low-voltage device regions.

* * * * *